(12) United States Patent
Wu et al.

(10) Patent No.: US 11,816,277 B2
(45) Date of Patent: Nov. 14, 2023

(54) TOUCH DISPLAY PANEL AND TOUCH DISPLAY DEVICE

(71) Applicant: Shanghai Tianma AM-OLED Co., Ltd., Shanghai (CN)

(72) Inventors: Yingying Wu, Shanghai (CN); Xinzhao Liu, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 17/370,715

(22) Filed: Jul. 8, 2021

(65) Prior Publication Data
US 2021/0333919 A1    Oct. 28, 2021

(30) Foreign Application Priority Data

Dec. 31, 2020   (CN) .......................... 202011632756.X

(51) Int. Cl.
| | |
|---|---|
| *G06F 3/041* | (2006.01) |
| *G06F 3/047* | (2006.01) |
| *H10K 50/84* | (2023.01) |
| *H10K 59/40* | (2023.01) |
| *H10K 102/00* | (2023.01) |

(52) U.S. Cl.
CPC ............ *G06F 3/0412* (2013.01); *G06F 3/047* (2013.01); *H10K 50/84* (2023.02); *H10K 59/40* (2023.02); *H10K 2102/311* (2023.02)

(58) Field of Classification Search
None
See application file for complete search history.

(56) References Cited

U.S. PATENT DOCUMENTS

2019/0377445 A1* 12/2019  Jeong .................. G06F 3/047

FOREIGN PATENT DOCUMENTS

| CN | 103941908 A | 7/2014 | |
|---|---|---|---|
| CN | 107180848 A | 9/2017 | |
| EP | 3217265 A1 * | 9/2017 | ....... G02F 1/133305 |

OTHER PUBLICATIONS

Machine translation of WO 2018034244 A1 into English; Ochi et al. (Year: 2018).*

* cited by examiner

*Primary Examiner* — Brian M Butcher
(74) *Attorney, Agent, or Firm* — von Briesen & Roper, s.c.

(57) ABSTRACT

Provided are touch display panel and touch display device. The touch display panel includes a substrate including a display area and a non-display area, a light-emitting component located within the display area, an encapsulation layer covering the light-emitting component and at least part of the non-display area, a touch layer located at a side of the encapsulation layer away from the light-emitting component and including multiple touch electrodes, and multiple touch wires directly electrically connected to the touch electrodes and extending to the non-display area. The non-display area includes a first area and a second area, at least part of film layers within the first area are formed with a through hole and/or a groove, the touch wires extend along a surface of the first area and extend into the second area. The second area is located at a side of the first area away from the display area.

17 Claims, 9 Drawing Sheets

TOUCH DISPLAY PANEL AND TOUCH DISPLAY DEVICE

CROSS-REFERENCE TO RELATED APPLICATION

This application claims priority to Chinese Patent Application No. 202011632756.X filed Dec. 31, 2020, the disclosure of which is incorporated herein by reference in its entirety.

TECHNICAL FIELD

The present disclosure relates to the field of display technologies, and in particular, to a touch display panel and a touch display device.

BACKGROUND

Since touch operation is a simple and convenient man-machine interaction manner, touch function has been integrated into display panels for more and more products. Touch panels may be classified into Add on Mode Touch Panel, On Cell Touch Panel, and In Cell Touch Panel according to the structure. Touch electrodes of In Cell Touch Panel are disposed inside a display panel, which may reduce an overall thickness of a module and also greatly reduce the manufacturing cost of the touch panel, and thus the In Cell Touch Panel has been widely used.

When manufacturing the display panel, in order to achieve narrow bezel design of the display panel, a bending area is usually disposed in a non-display area, and two lateral sides of the bending area are provided with transfer holes for transferring touch wires to transfer wires in another film layer. Since some inorganic layers in the display panel are generally formed through chemical vapor deposition (CVD) process, when the bezel of the display panel is relatively narrow, a boundary of the CVD may cover the transfer holes, whereby contact resistances between the touch wires and the transfer wires are increased, which affects the touch performance.

SUMMARY

Embodiments of the present disclosure provide a touch display panel and a touch display device.

In an embodiment of the present disclosure, a touch display panel is provided. The touch display panel includes a substrate, a light-emitting component, an encapsulation layer, a touch layer and multiple touch wires. The substrate includes a display area and a non-display area. The light-emitting component is located within the display area. The encapsulation layer covers the light-emitting component and at least part of the non-display area. The touch layer is located at a side of the encapsulation layer away from the light-emitting component, and the touch layer includes multiple touch electrodes. The multiple touch wires are directly electrically connected to the multiple touch electrodes, and the multiple touch wires extend to the non-display area. The non-display area includes a first area and a second area, at least part of film layers within the first area are provided with a through hole and/or a groove, the multiple touch wires extend along a surface of the first area and extend into the second area, and the second area is located at a side of the first area away from the display area.

In an embodiment of the present disclosure, further provided is a touch display device including a touch display panel. The touch display panel includes a substrate, a light-emitting component, an encapsulation layer, a touch layer and multiple touch wires. The substrate includes a display area and a non-display area. The light-emitting component is located within the display area. The encapsulation layer covers the light-emitting component and at least part of the non-display area. The touch layer is located at a side of the encapsulation layer away from the light-emitting component, and the touch layer includes multiple touch electrodes. The multiple touch wires are directly electrically connected to the multiple touch electrodes, and the multiple touch wires extend to the non-display area. The non-display area includes a first area and a second area, at least part of film layers within the first area are provided with a through hole and/or a groove, the multiple touch wires extend along a surface of the first area and extend into the second area, and the second area is located at a side of the first area away from the display area.

In the embodiments of the present disclosure, the touch layer is disposed at the side of the encapsulation layer away from the light-emitting component, so that TPOT, which is an In Cell touch structure, is formed, which is favorable for achieving the lightening and thinning of the touch display panel. The at least part of film layers within the first area of the non-display area are provided with the through hole and/or the groove, and the touch wires extend along the surface of the first area, so that the transfer holes are prevented from being formed near a boundary of a CVD, and further the touch performance is prevented from being affected by a fact that resistances of the touch wires are increased if the transfer holes are covered by an inorganic layer, whereby the touch performance of the touch display panel is improved.

DETAILED DESCRIPTION

Figure 1:
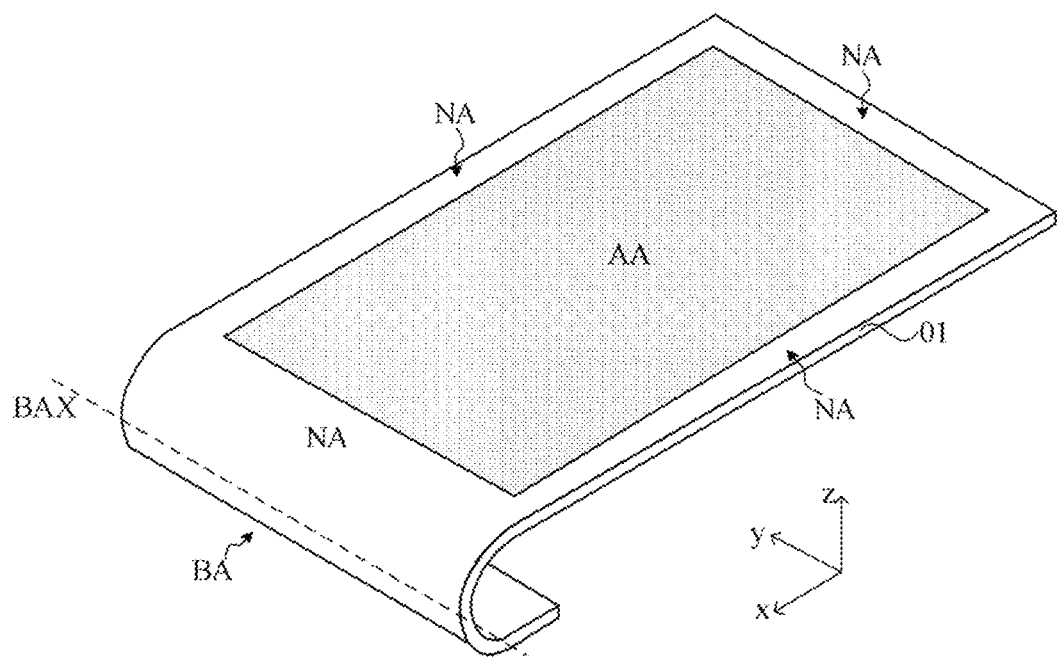
FIG. 1 is a schematic structural view of a display panel in related technology.

The present disclosure will be further described in detail in conjunction with the drawings and embodiments below. It is understandable that specific embodiments described herein are merely used for explaining the present disclosure and are not intended to limit the present disclosure. It is noted that, for ease of description, only some, but not all, of the structures related to the present disclosure are shown in the drawings.

Terms used in the embodiments of the present disclosure are merely used for describing specific embodiments and are not intended to limit the present disclosure. It is noted that the nouns of locality such as "on", "under", "left" and "right" described in the embodiments of the present disclosure are described from the perspective of the drawings, and should not be understood as limiting the embodiments of the present disclosure. In addition, in this context, it should also be understood that when an element is formed "on" or "under" another element, it may not only be directly formed "on" or "under" another element, and may alternatively be indirectly formed "on" or "under" another element through an intervening element. The terms "first", "second" and the like are used for description only, distinguishing different components; they do not represent any order, quantity, or importance. For those of ordinary skilled in the art, the specific meanings of the above terms in the present disclosure may be understood according to specific situations. In examples below, the x-axis, y-axis, and z-axis are not limited to three axes in a rectangular coordinate system, and may have broader interpretation. For example, any two of the x-axis, y-axis, and z-axis may be perpendicular to each other, or the x-axis, y-axis, and z-axis may represent different directions that are not perpendicular to each other.

Various modifications and changes may be made in the present disclosure without departing from the spirit or scope of the present disclosure, as will be apparent to those skilled in the art. It is therefore intended to cover modifications and variations of the present disclosure which fall within the scope of the appended claims (claimed technical solution) and their equivalents. It is noted that implementations provided in the embodiments of the present disclosure may be combined with each other in case of no contradiction.

Figure 2:
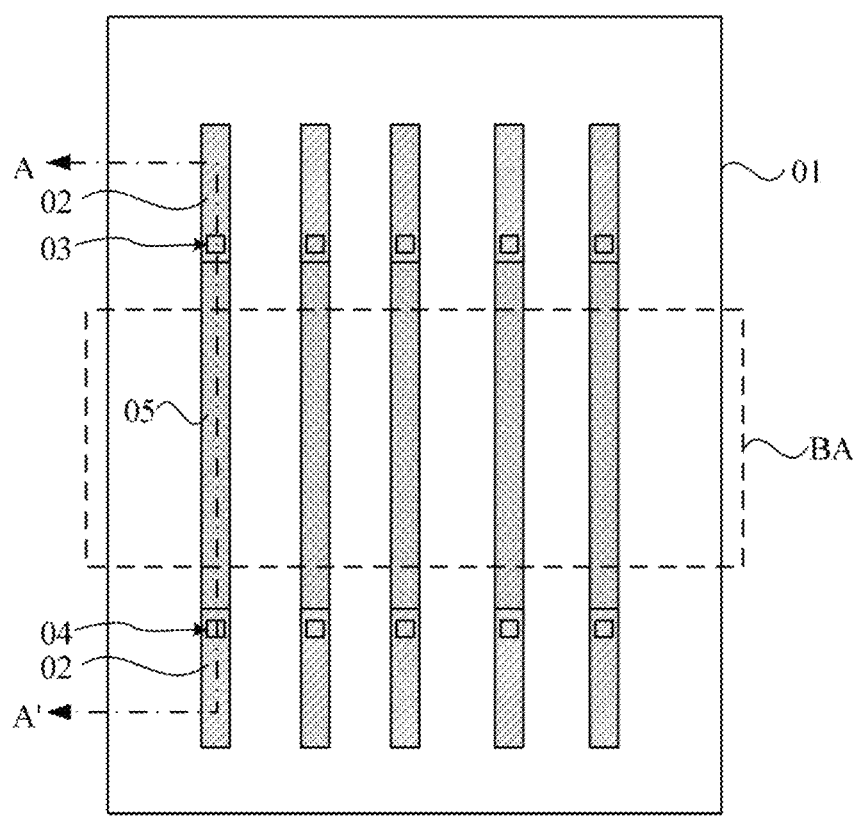
FIG. 2 is a schematic plan view of a part of a non-display area in FIG. 1.
Figure 3:
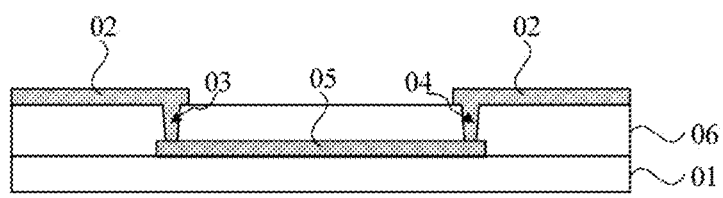
FIG. 3 is a schematic cross-sectional view taken along a section line AA' of FIG. 2.

FIG. 1 is a schematic structural view of a display panel in related technology, FIG. 2 is a schematic plan view of a part of a non-display area in FIG. 1, and FIG. 3 is a schematic cross-sectional view taken along a section line AA' of FIG. 2. Referring to FIG. 1, the display panel includes a display area AA and a non-display area NA, and in order to reduce a bezel of the display panel, a substrate 01 in the display panel is partially curved. For ease of description, FIG. 2 shows a non-display area in a non-curved state. For ease of description, cross-sectional views and plan views relating to exemplary embodiments disclosed below also show the non-display area in the non-curved state.

As shown in FIG. 1, the substrate 01 of the display panel is partitioned into a display area AA and a non-display area NA surrounding the display area AA, where the display area AA is provided with a display component (not shown in FIG. 1) and displays an image. The non-display area NA includes a bending area BA that is curved about a bending axis BAX. The bending area BA may refer to a bending area having a radius of curvature. The bending area BA extends in a first direction (+y direction) and is arranged along a second direction (+x direction) intersecting the first direction while being distributed in a third direction (+z direction) perpendicular to each of the first direction and the second direction. In addition, the substrate 01 is curved about the bending axis BAX extending in the first direction (+y direction), as shown in FIG. 1. The substrate 01 may be made of various flexible or curvable materials, for example, polymeric resins such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

Multiple pixels for displaying images may be disposed in the display area AA of the substrate 01. The display area AA may include, for example, light-emitting component, thin film transistor (TFT), and capacitor Cst (not shown in FIG. 1). The display area AA may further include signal wires for transmitting direct current signals such as a driver power supply line, a common power supply line, as well as gate lines for transmitting gate signals, data lines for transmitting data signals, and the like (neither shown in FIG. 1). Pixels may be formed in the display area AA, and the pixels may display an image based on an electrical combination of TFTs, capacitors, display components, and the like connected to the gate lines, the data lines, and the driver power supply line. The luminance of the pixel may correspond to a drive current flowing through the display component in response to a data signal according to a drive power and a common power supplied to the pixel.

Referring to FIGS. 2 and 3, the non-display area includes multiple touch wires 02, in order to ensure the curve performance of the bending area BA, two sides of the bending area BA are provided with a first switch hole 03 and a second switch hole 04, the bending area BA is provided with a switch wire 05, and the touch wire 02 extending out of the display area is switched to the switch wire 05 through the first switch hole 03 above the bending area BA (with a direction in FIG. 2 as a reference), and is switched back to the touch wire 02 through the second switch hole 04 below the bending area BA. An insulating layer 06 is disposed between the touch wire 02 and the switch wire 05, and the insulating layer 06 may be one or more organic layers, one or more inorganic layers, or multiple layers in which each layer is organic or inorganic. In a manufacturing process of the display panel, due to a fact that the first transfer hole 03 is close to the display area, when an inorganic layer is prepared through a CVD process, a boundary of the inorganic layer may partially cover the first switch hole 03, so that the first switch hole 03 cannot be completely etched, a contact resistance between the touch wire 02 and the switch wire 05 is increased, and the touch performance is affected.

In view of the above, an embodiment of the present disclosure provides a touch display panel. The touch display panel includes a substrate, a light-emitting component, an encapsulation layer, a touch layer and multiple touch wires. The substrate includes a display area and a non-display area. The light-emitting component is located within the display area. The encapsulation layer covers the light-emitting component and at least part of the non-display area. The touch layer is located at a side of the encapsulation layer away from the light-emitting component, and the touch layer includes multiple touch electrodes. The multiple touch wires are directly electrically connected to the multiple touch electrodes, and the multiple touch wires extend to the non-display area. The non-display area includes a first area and a second area, at least part of film layers within the first area are provided with a through hole and/or a groove. The multiple touch wires extend along a surface of the first area and extend to the second area, where the second area is located at a side of the first area away from the display area.

The touch display panel provided in the embodiment may be an organic light-emitting display pane. In the organic light-emitting display panel, in order to prevent moisture and oxygen from affecting an organic light-emitting component, a thin film encapsulation (TFE) process needs to be used for forming a thin film encapsulation layer on the organic light-emitting component, and a touch electrode may be formed on the thin film encapsulation layer to form a TP on TFE (TPOT) structure.

According to the technical scheme of the embodiment of the present disclosure, the touch layer is disposed at the side of the encapsulation layer away from the light-emitting component, so that TPOT, which is an In Cell touch structure, is formed, and the lightening and thinning of the touch display panel are facilitated; the through hole and/or the groove is formed in the at least part of film layers within the first area of the non-display area, and the touch wires extend along the surface of the first area, so that the transfer hole is prevented from being formed near the boundary of the CVD, and further the touch performance is prevented from being affected by a fact that a resistance of the touch wire is increased if the transfer hole is covered by an inorganic layer, whereby the touch performance of the touch display panel is improved.

Technical schemes in the embodiments of the present disclosure will be clearly and completely described below with reference to the drawings in the embodiments of the present disclosure.

Figure 4:
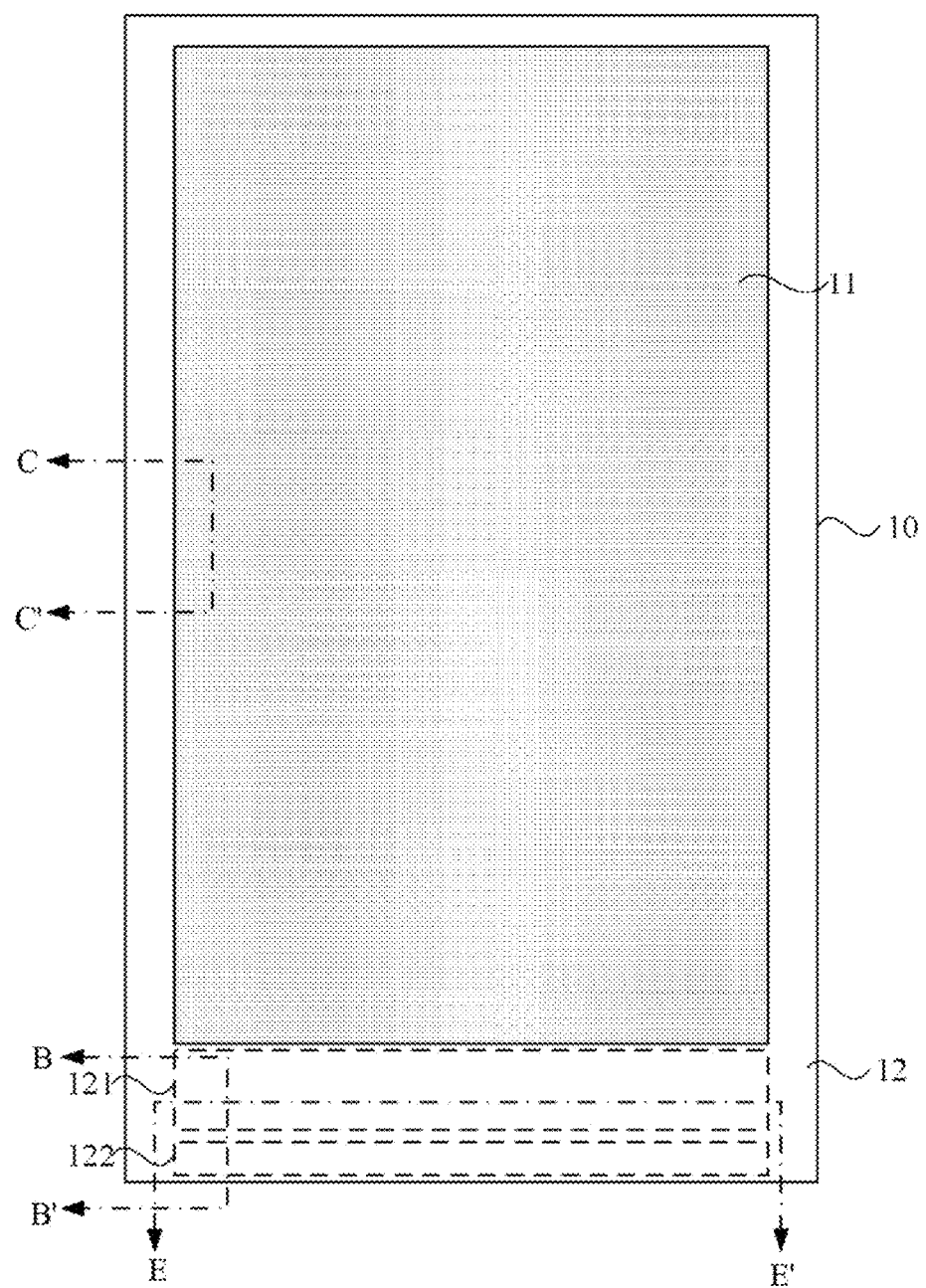
FIG. 4 is a schematic top view of a touch display panel provided in an embodiment of the present disclosure.
Figure 5:
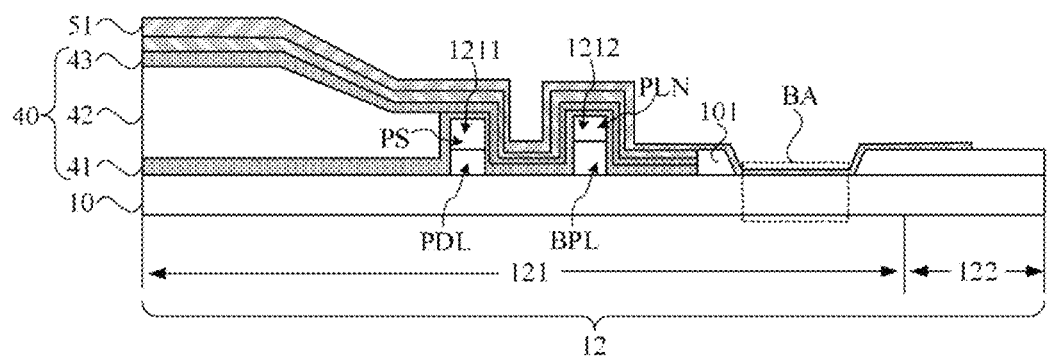
FIGS. 5 to 7 are schematic cross-sectional views taken along a section line BB' of FIG. 4, respectively.
Figure 6:
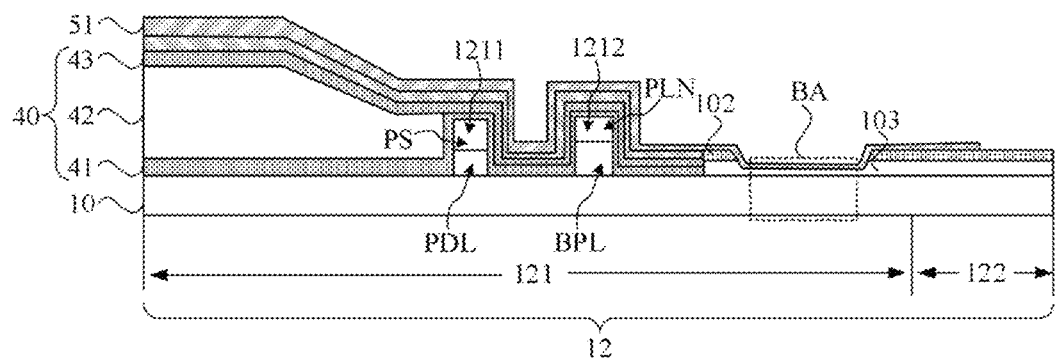
Figure 7:
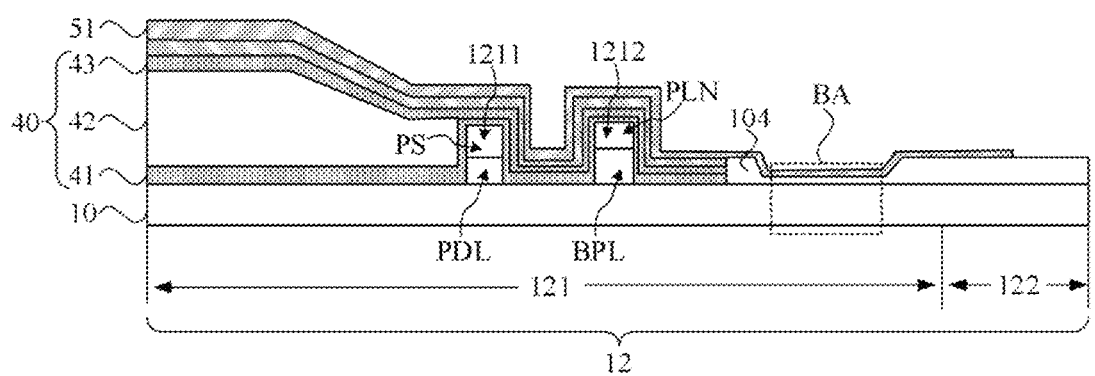

Exemplarily, FIG. 4 is a schematic top view of a touch display panel provided in an embodiment of the present disclosure, and each of FIGS. 5 to 7 is a schematic cross-sectional view taken along a section line BB' of FIG. 4. Referring to FIGS. 4 to 7, the touch display panel provided in the embodiment includes a substrate 10, a light-emitting component (not shown in FIG. 4) and an encapsulation layer 40. The substrate 10 includes a display area 11 and a non-display area 12. The light-emitting component is located within the display area 11. The encapsulation layer 40 covers the light-emitting component and at least part of the non-display area 12. The encapsulation layer 40 may be a thin film encapsulation layer and is located on the light-emitting component, and the encapsulation layer 40 includes a first inorganic encapsulation layer 41, an organic encapsulation layer 42 and a second inorganic encapsulation layer 43 which are sequentially disposed in a direction away from the substrate 10 and are used for preventing moisture and oxygen from corroding the light-emitting component. The first inorganic encapsulation layer 41 may be made from at least one of silicon oxide, silicon nitride, or silicon oxynitride. An upper surface of the first inorganic encapsulation layer 41 is generally uneven since the first inorganic encapsulation layer 41 is formed along a structure under the first inorganic encapsulation layer 41. Unlike the first inorganic encapsulation layer 41, the organic encapsulation layer 42 covering the first inorganic encapsulation layer 41 may have a flat upper surface. Specifically, an upper surface of the organic encapsulation layer 42 corresponding to the display area 11 may be substantially flat. The organic encapsulation layer 42 may be made from at least one selected from a group consisting of polyethylene terephthalate (PET), polyethylene naphthalate (PEN), polycarbonate (PC), polyimide (PI), polyethersulfone (PES), polyoxymethylene (POM), polyarylate, and hexamethyldisiloxane (HMDSO). The second inorganic encapsulation layer 43 may cover the organic encapsulation layer 42, and may be made from at least one of silicon oxide, silicon nitride, or silicon oxynitride. A periphery of the second inorganic encapsulation layer 43 located outside the display area 11 may contact the first inorganic encapsulation layer 41 so that the organic encapsulation layer 42 is not exposed to the outside. In other embodiments, the encapsulation layer 40 may be provided with more inorganic and organic encapsulation layers. Since the encapsulation layer 40 has a multi-layer structure including the first inorganic encapsulation layer 41, the organic encapsulation layer 42, and the second inorganic encapsulation layer 43, even if a crack is present in the encapsulation layer 40, the crack does not extend between the first inorganic encapsulation layer 41 and the organic encapsulation layer 42 or between the organic encapsulation layer 42 and the second inorganic encapsulation layer 43. Therefore, external moisture or oxygen may be prevented from permeating into the display area 11. The touch layer is located at a side of the encapsulation layer 40 away from the light-emitting component, the touch layer includes multiple touch electrodes (not shown in FIG. 4), and in specific implementation, the touch electrodes in the touch layer may be arranged as single-layer or double-layer, and may be formed by transparent metal oxides such as indium tin oxide (ITO) or formed by a metal mesh composed of metal lines, the arranging manner of the touch electrodes is not limited in the embodiments of the present disclosure. Multiple touch wires 51 may be disposed on a same layer as the touch layer, the touch wires 51 are directly electrically connected to the touch electrodes, and the touch wires 51 extend to the non-display area 12. The non-display area 12 includes a first area 121 and a second area 122, referring to FIG. 5, a film layer 101 within the first area 121 is provided with a through hole, and the touch wire 51 extends along side walls and a bottom surface of the through hole and extends to the second area 122. Referring to FIG. 6, a film layer 102 within the first area 121 is provided with a through hole, a film layer 103 is provided with a groove, and the touch wire 51 extends along side walls of the through hole, side walls of the groove, and a bottom surface of the groove, and extends to the second area 122. Referring to FIG. 7, a film layer 104 within the first area 121 is provided with a groove, and the touch wire 51 extends along side walls and a bottom surface of the groove and extends to the second area 122, so that no transfer hole needs to be arranged, and the inorganic encapsulation layer is prevented from affecting the resistance of the touch wire. Still referring to FIGS. 5 to 7, the first area 121 is also provided with a first retaining wall 1211 and a second retaining wall 1212. The first retaining wall 1211 is used for defining a boundary of the organic encapsulation layer 42 in the encapsulation layer 40, and the first inorganic encapsulation layer 41 and the second inorganic encapsulation layer 43 may extend to the second retaining wall 1212, so that the effect of the encapsulation layer 40 in blocking moisture and oxygen is further improved. The first retaining wall 1211 and the second retaining wall 1212 may essentially include an organic layer, exemplarily, the first retaining wall 1211 in FIGS. 5 to 7 may include a pixel defining layer PDL and a photo spacer PS which are stacked, and the second retaining wall 1212 may include an organic insulating layer BPL and a planarization layer PLN which are stacked, the pixel definition layer PDL, the photo spacer PS, the organic insulating layer BPL and the planarization layer PLN are all film layers with the same definition as the film layers in the display area and each of them is made of an organic material, and the film layers are named according to corresponding functions. It should be noted that FIGS. 5 to 7 show only film structures related to the technical schemes of the embodiments of the present disclosure, and following drawings are similar to those described above and omit part of the film layers, and in specific implementation, those skilled in the art may set other film layers of the touch display panel according to an existing process.

Figure 8:
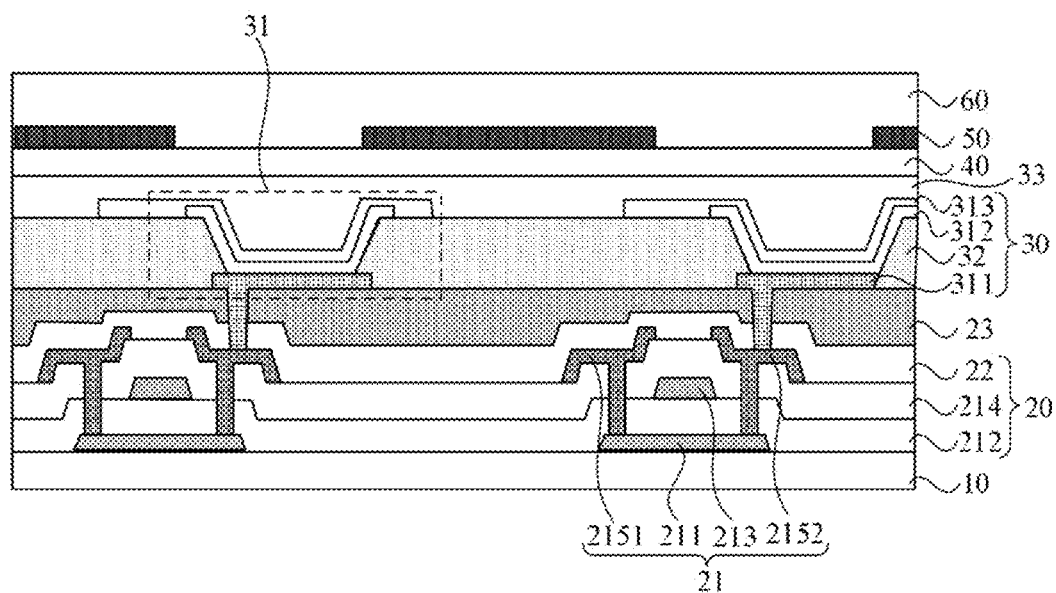
FIG. 8 is a schematic cross-sectional view taken along a section line CC' of FIG. 4.

For the structure in the display area 11, FIG. 8 is a schematic cross-sectional view taken along a section line CC' of FIG. 4. Referring to FIG. 8, a touch display panel includes a substrate 10, the substrate 10 may be flexible and thus extensible, foldable, curvable or rollable, so that the touch display panel may be extensible, foldable, curvable or rollable. The substrate 10 may be formed of any suitable insulating material having flexibility. The substrate 10 may serve to block oxygen and moisture, prevent moisture or impurities from diffusing through the substrate 10, and an upper surface of the substrate 10 may be formed into a flat surface. For example, the substrate 10 may be formed of a polymer material such as polyimide (PI), polycarbonate (PC), polyethersulfone (PES), polyethylene terephthalate (PET), polyethylene naphthalate (PEN), polyaryl compound (PAR), or glass fiber reinforced plastic (FRP), and the substrate 10 may be transparent, translucent, or opaque. Optionally, the touch display panel may further include a buffer layer (not shown in FIG. 8) located on the substrate 10, the buffer layer may cover the entire upper surface of the substrate 10. Alternatively, the substrate 10 may be rigid such as a glass substrate, so as to form a rigid touch display panel.

An array layer 20 is located at a side of the substrate 10, specifically, the array layer 20 is located at a side of the substrate 10 facing a display surface or a touch surface of the touch display panel. The array layer 20 may include multiple thin film transistors 21 (TFTs) and pixel circuits composed of the thin film transistors 21 and used for driving light-emitting components in a display layer. Top-gate thin film transistor is used as an example for structural description in the embodiment. The thin film transistor layer 21 includes an active layer 211 located on the substrate 10, the active layer 211 may be an amorphous silicon material, a polycrystalline silicon material, a metal oxide material, or the like. The active layer 211 may be formed by adopting a low-temperature amorphous silicon technology when being made of a polycrystalline silicon material, namely an amorphous silicon material is formed into the polycrystalline silicon material through laser melting. Moreover, various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method may also be used. The active layer 211 further includes a source area and a drain area formed by doping N-type impurity ions or P-type impurity ions, a channel area is formed between the source area and the drain area. The array layer 20 further includes a gate insulating layer 212 located on the active layer 211; the gate insulating layer 212 includes an inorganic layer such as silicon oxide, silicon nitride, and may include a single layer or multiple layers. The thin film transistor layer 21 further includes a gate 213 on the gate insulating layer 212; the gate 213 may include a single layer or multiple layers of gold (Au), silver (Ag), copper (Cu), nickel (Ni), platinum (Pt), palladium (Pd), aluminum (Al), molybdenum (MO), or chromium (Cr), or alloys such as aluminum (Al): neodymium (Nd) alloy or molybdenum (MO): tungsten (W) alloy, which may be selected according to actual circumstances in specific implementation. The array layer 20 further includes an interlayer insulating layer 214 located on the gate 213; the interlayer insulating layer 214 may be made from an inorganic material or an organic material. The inorganic material may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one selected from an acrylic resin, a methacrylic resin, a polyisoprene, a vinyl resin, an epoxy resin, a urethane resin, a cellulose resin, and a perylene resin. The thin film transistor layer 21 further includes a source electrode 2151 and a drain electrode 2152 located on the interlayer insulating layer 214. The source electrode 2151 and the drain electrode 2152 may be electrically connected to the source area and the drain area respectively through contact holes, the contact holes may be formed by selectively removing the gate insulating layer 212 and the interlayer insulating layer 214.

The array layer 20 may further include a passivation layer 22. Optionally, the passivation layer 22 is located on the source electrode 2151 and the drain electrode 2152 of the thin film transistor 21. The passivation layer 22 may be formed of an inorganic material such as silicon oxide or silicon nitride or may be formed of an organic material. The touch display panel may further include a planarization layer 23. Optionally, the planarization layer 23 is located on the passivation layer 22. The planarization layer 23 may include an organic material such as acrylic, polyimide (PI), or benzocyclobutene (BCB), and the planarization layer 23 has a planarization effect.

A display layer 30 is located at a side of the array layer 20 away from the substrate 10, and the display layer 30 includes multiple light-emitting components 31. Optionally, the display layer 30 is located on the planarization layer 23. The display layer 30 includes an anode layer 311, an intermediate layer 312, and a cathode layer 313 which are sequentially disposed in a direction away from the substrate 10. The anode layer 311 may be formed of various conductive materials. For example, the anode layer 311 may be formed as a transparent electrode or a reflective electrode according to its use. When the anode is formed as the transparent electrode, it may include indium tin oxide (ITO), indium zinc oxide (IZO), zinc oxide (ZnO), indium oxide ($In_2O_3$) or the like; when the anode is formed as the reflective electrode, a reflective layer may be formed of silver (Ag), magnesium (Mg), aluminum (Al), platinum (Pt), palladium (Pd), gold (Au), nickel (Ni), neodymium (Nd), iridium (Ir), chromium (Cr) or a mixture thereof, and the ITO, IZO, ZnO, $In_2O_3$ or the like may be formed on the reflective layer. The intermediate layer 312 may include a low molecular material or a high molecular material. When the intermediate layer 312 includes the low molecular material, the intermediate layer 312 may include an emission layer (EML), and may further include at least one of a hole injection layer (HIL), a hole transport layer (HTL), an electron transport layer (ETL), or an electron injection layer (EIL). The intermediate layer 312 may include various organic materials such as copper phthalocyanine (CuPc), N,N'-bis(naphthalene-1-yl)-

N,N'-diphenyl-benzidine (NPB), or tris-8-Hydroxyquinoline-aluminum (Alq3). The intermediate layer 312 may be formed by vapor deposition.

The intermediate layer 312 may include the HTL and the EML when the intermediate layer 312 includes a high molecular material. The HTL may include PEDOT, and the EML may include polyphenylene vinylene (PPV) high molecular materials and polyfluorene high molecular materials. The intermediate layer 312 may be formed by screen printing, inkjet printing, laser induced thermal imaging (LITI), or the like.

The intermediate layer 312, however, is not limited to the above examples. The intermediate layer 312 may include a single layer across multiple anode layers 311 or multiple layers patterned relative to each of the anode layers 311. The display layer 30 further includes a pixel definition layer 32 located at a side of the anode layer 311 away from the array layer 20. The pixel definition layer 32 may be formed of an organic material such as polyimide (PI), polyamide, benzocyclobutene (BCB), an acrylic resin or a phenolic resin, or may be formed of an inorganic material such as SiNx. When the cathode layer 313 is formed as a transparent electrode, a compound having a small work function, which contains, e.g., lithium (Li), calcium (Ca), lithium/calcium fluoride (LiF/Ca), lithium/aluminum fluoride (LiF/Al), aluminum (Al), magnesium (Mg) or a combination thereof, may be initially deposited on a light-emitting layer by evaporation, and a material for forming transparent electrodes, such as ITO, IZO, ZnO or $In_2O_3$, may be deposited on the compound. When a cathode is formed as a reflective electrode, the cathode may be formed by evaporating Li, Ca, LiF/Ca, LiF/Al, Al, Mg, or mixtures thereof over the entire surface of the substrate.

Optionally, the anode layer 311 includes multiple anode patterns in one-to-one correspondence with the pixels, and the anode pattern in the anode layer 311 is connected to the source electrode 2151 or the drain electrode 2152 of the thin film transistor 21 through a via hole in the planarization layer 23. The pixel definition layer 32 includes multiple openings exposing the anode layer 311, and the pixel definition layer 32 may cover edges of the anode patterns. The intermediate layer 312 is at least partially filled within the openings of the pixel defining layer 32 and is in contact with the anode layer 311.

Optionally, the anode layer 311, the intermediate layer 312 and the cathode layer 313 defined by each opening of the pixel defining layer 32 constitute a light-emitting component 31 (i.e., shown in a dashed box in FIG. 8), each light-emitting component 31 may emit light of different colors according to different intermediate layers 312. Each light-emitting component 31 constitutes one sub-pixel and multiple sub-pixels collectively display an image.

Optionally, the touch display panel further includes an encapsulation layer 40. The encapsulation layer 40 is located on the display layer 30, and completely covers the display layer 30 so as to seal the display layer 30. In order to achieve planarization of the display layer 30, a planarization layer 33 may be further provided on the display layer 30. Optionally, the encapsulation layer 40 may be a thin film encapsulation layer and is located on the planarization layer 33, and the encapsulation layer 40 includes a first inorganic encapsulation layer, an organic encapsulation layer and a second inorganic encapsulation layer (specific film layers of the encapsulation layer 40 are not shown in FIG. 8) which are sequentially disposed in a direction away from the substrate 10 and are used for preventing moisture and oxygen from corroding the light-emitting components 31. Of course, in other optical embodiments of the present disclosure, the encapsulation layer 40 may include stacked organic and inorganic material layers in any number as desired, at least one organic material layer and at least one inorganic material layer are alternately deposited, and the lowermost layer and the uppermost layer are inorganic material layers.

Figure 9:
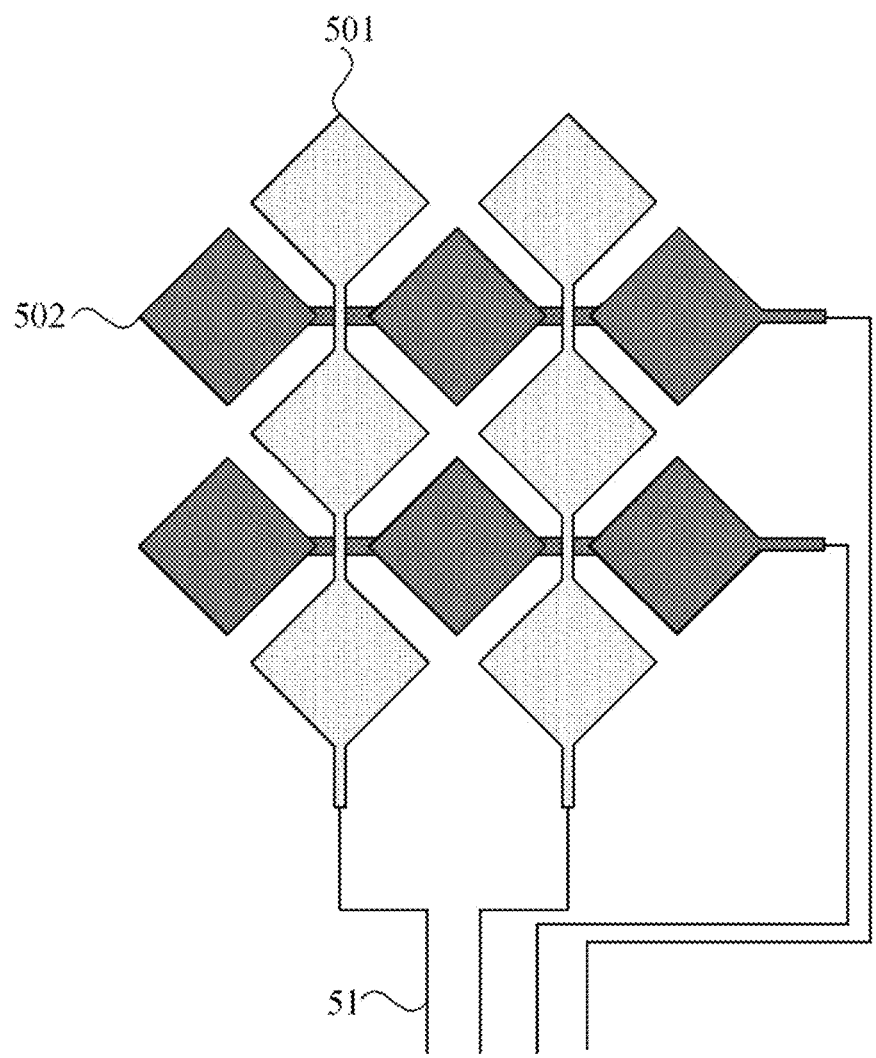
FIG. 9 is a schematic top view of a touch layer provided in an embodiment of the present disclosure.

The touch display panel further includes a touch layer 50 located on the encapsulation layer 40, the touch layer 50 includes multiple touch electrodes for achieving a touch function. In specific implementation, self-capacitance or mutual-capacitance manners may be adopted by the touch electrodes. The touch layer 50 may be provided with touch electrodes in a single-layer or touch electrodes in a double-layer; the touch layer 50 may be provided with metal mesh-shaped touch electrodes, the metal mesh-shaped touch electrodes include multiple metal lines extending along two intersecting directions, the metal lines extending in different directions intersect to form a mesh, which may be selected according to actual circumstances in specific implementation. Exemplarily, FIG. 9 is a schematic top view of a touch layer provided in an embodiment of the present disclosure, a mutual capacitance manner is used as an example, the touch layer includes multiple touch drive electrodes 501 and touch sensing electrodes 502, and each touch drive electrode 501 and each touch sensing electrode 502 are directly electrically connected to two touch wires 51, respectively.

The touch display panel further includes a protective layer 60 located on the display layer 30. Optionally, the protective layer 60 is a film layer on an outermost side of the touch display panel and may be a protective cover plate or a protective film. The protective layer 60 may be bonded to a film layer inside the touch display panel adjacent to the protective layer by means of an optically clear adhesive (OCA), and a surface of the protective layer 60 is a touch operation surface of the display panel.

On the basis of the embodiment described above, with continued reference to FIGS. 5 to 7, optionally, the non-display area 12 includes the bending area BA located within the first area 121. The bending area BA is disposed in the non-display area 12, the second area 122 of the non-display area 12 may be folded to an opposite side of a light-emitting side of the touch display panel, so that the bezel of the touch display panel is reduced.

In specific implementation, the substrate 10 may be made of a material such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP), which may be flexibly selected according to actual needs in specific implementation, and is not limited in the embodiments of the present disclosure.

Figure 10:
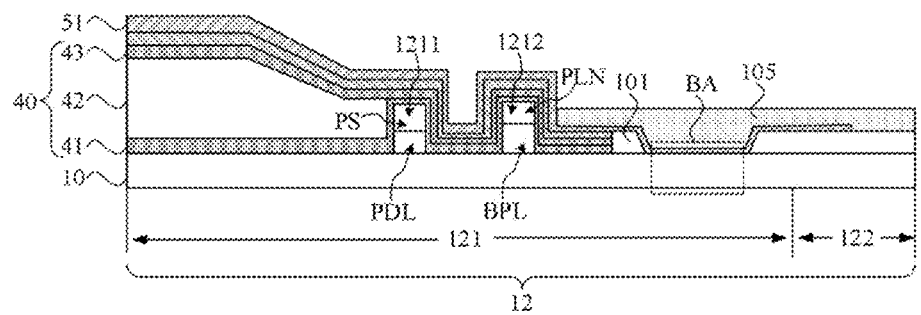
FIG. 10 is another schematic cross-sectional view taken along a section line BB' of FIG. 4.

FIG. 10 is another cross-sectional view taken along a section line BB' of FIG. 4. Referring to FIG. 10, optionally, the non-display area 12 further includes a first organic layer 105 covering the touch wires 51 in the first area 121.

It is understood that an organic layer is generally thick and has good bending performance, the first organic layer 105 is disposed to cover the touch wires 51, so that the effect of protecting the touch wires 51 may be achieved, and the risk of breakage of the touch wires 51 upon being bent is reduced. In specific implementation, when the bending area BA is bent, there may be a difference in stresses inside different areas of the first organic layer 105, and optionally, the first organic layer further includes multiple first grooves located within the first area in order to facilitate the release of bending stresses.

Figure 11:
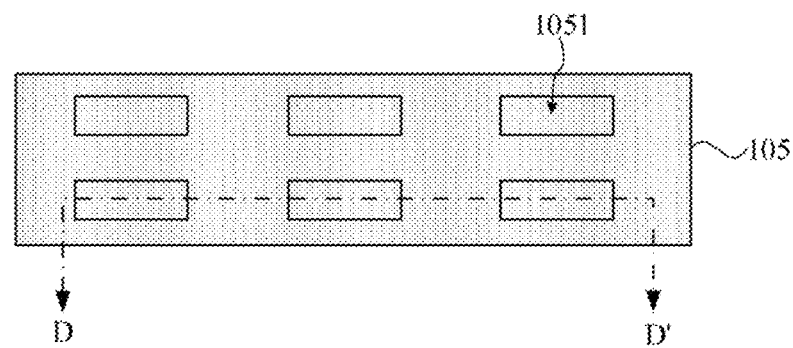
FIG. 11 is a schematic top view of a first organic layer provided in an embodiment of the present disclosure.
Figure 12:
FIG. 12 is a schematic cross-sectional view taken along a section line DD' of FIG. 11.

Exemplarily, FIG. 11 is a schematic top view of a first organic layer provided in an embodiment of the present disclosure, and FIG. 12 is a schematic cross-sectional view taken along a section line DD' of FIG. 11; referring to FIGS. 11 and 12, the first organic layer 105 is provided with multiple first grooves 1051, and the first grooves 1051 are disposed so that the release of stresses of the bending area is facilitated, and thus the reliability of the bending area is improved.

Figure 13:
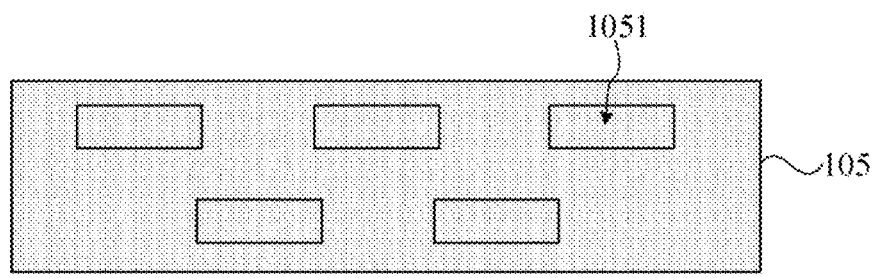
FIG. 13 is another schematic top view of a first organic layer provided in an embodiment of the present disclosure.

It is understood that, in specific implementation, a shape, positions, a quantity and the like of the first grooves 1051 are not limited, and a depth of the first grooves 1051 is also not limited. The first grooves may at most penetrate the first organic layer 105, that is, through holes are formed. Exemplarily, FIG. 13 is another schematic top view of a first organic layer provided in an embodiment of the present disclosure, and unlike FIG. 12, first grooves 1051 in different rows in the embodiment are disposed in a staggered manner so as to further uniformly release an internal stress of the bending area upon being bent.

Optionally, the touch display panel provided in an embodiment further includes an array layer, and the array layer is located between the substrate and the light-emitting components, the array layer includes multiple signal wires, and at least part of the multiple signal wires extend to the non-display area.

It is understood that the array layer includes multiple thin film transistors (TFTs) and pixel circuits composed of the thin film transistors and used for driving the light-emitting components in the display layer. The pixel circuit is generally provided with multiple layers of signal wires (such as a scanning signal line disposed on the same layer as a gate electrode, a data signal line disposed on the same layer as a source electrode) made of a metal, and part of the signal wires extend to the non-display area and are connected to circuits such as a driver chip and a shifting register.

Optionally, the touch wires extend on side walls and a bottom surface of the first area, and touch wires located on the bottom surface of the first area are located on a same layer as signal wires extending to the non-display area.

Figure 14:
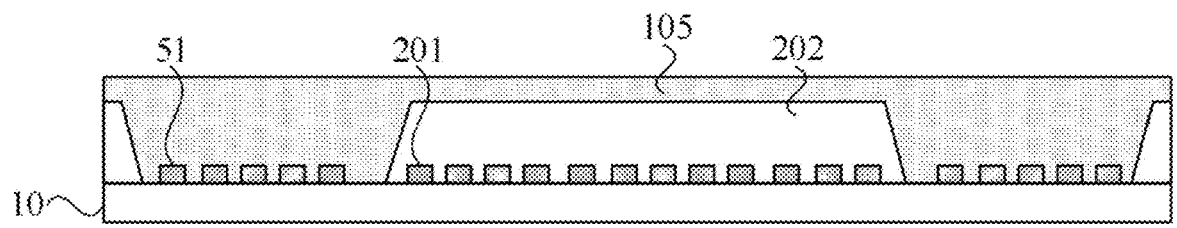
FIG. 14 is a schematic cross-sectional view taken along a section line EE$\alpha$ of FIG. 4.

It is understood that the side walls and the bottom surface of the first area may include groove side walls and a groove bottom surface of a film layer in which a groove is formed, such as side walls and a bottom surface of a groove of the film layer 104 in FIG. 7, and may alternatively include side walls of a film layer in which a through hole is formed and a bottom surface of an underlying film layer (e.g., as shown in FIG. 5), and may alternatively include side walls of a through-hole, side walls of a groove, and a bottom surface of the groove (e.g., as shown in FIG. 6). Exemplarily, FIG. 14 is a schematic cross-sectional view taken along a section line EE' of FIG. 4. Referring to FIG. 14, multiple touch wires 51 and multiple signal wires 201 are disposed in the first area, and the touch wires 51 and the signal wires 201 are disposed on a same layer. The insulating layer 202 may be an organic layer, such as a planarization layer. Optionally, the touch wires 51 and the signal wires 201 are made of a same material. In specific implementation, it may also be set that the materials and the thicknesses of other film layers in an area where the touch wire 51 is located and an area where the signal wire 201 is located are the same, the touch wire 51 and the signal wire 201 are made of the same material and formed through a same process, and therefore neutral surfaces in different areas are not changed, and thus the uneven stress distribution in case of bending at different areas is avoided.

In other embodiments, the touch wires 51 and the signal wires 201 may be made of different materials, which may be selected according to actual circumstances in specific implementation.

In other embodiments, optionally, the touch wires extend on side walls and a bottom surface of the first area, and touch wires located on the bottom surface of the first area are located on a different film layer from signal wires extending to the non-display area.

Figure 15:
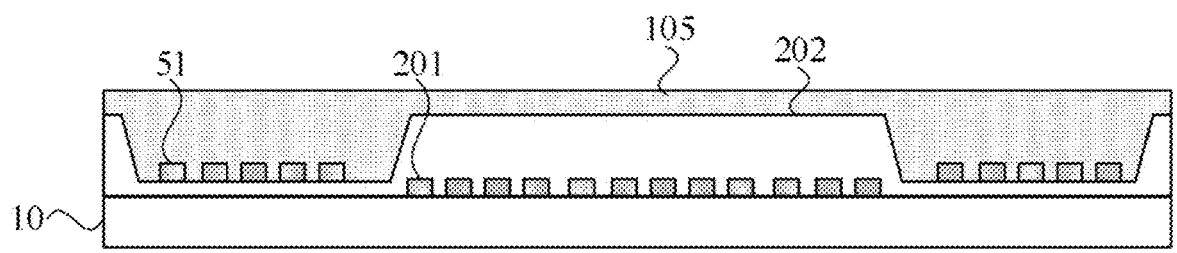
FIG. 15 is another schematic cross-sectional view taken along a section line EE$\alpha$ of FIG. 4.

It is understood that the side walls and bottom surface of the first area may include groove side walls and a groove bottom surface of a film layer in which a groove is formed, such as side walls and a bottom surface of a groove of the film layer 104 in FIG. 7, and may alternatively include side walls of a film layer in which a through hole is formed and a bottom surface of an underlying film layer (e.g., as shown in FIG. 5), and may further include side walls of a through-hole, side walls of a groove, and a bottom surface of the groove (e.g., as shown in FIG. 6). Exemplarily, FIG. 15 is another schematic cross-sectional view taken along a section line EE' of FIG. 4. Referring to FIG. 15, the first area is provided with multiple touch wires 51 and multiple signal wires 201, and the touch wires 51 and the signal wires 201 are located on different film layers. The touch wires 51 and the signal wires 201 are disposed on different layers, so that a layout space of the wires may be increased, and the anti-interference performance is improved. Optionally, the touch wires 51 and the signal wires 201 are made of a same material, so that the process is simplified, and the manufacturing cost is reduced.

In other embodiments, the touch wires 51 and the signal wires 201 may be made of different materials, which may be selected according to actual circumstances in specific implementation.

Optionally, the non-display area includes a bending area, and the bending area is located within the first area, a neutral surface of the bending area is designed according to a following formula:

$$\gamma = \frac{\sum_{k=1}^{n} E_k (h_k^2 - h_{k-1}^2)}{2 \sum_{k=1}^{n} E_k t_k} \quad (1)$$

Where n represents a quantity of laminated film layers, n is an integer larger than or equal to 2, $E_k$ represents an elastic modulus of a $k_{th}$ film layer, $t_k$ represents a thickness of the $k_{th}$ film layer, and $h_k$ represents a thickness from a $1_{st}$ film layer to the $k_{th}$ film layer.

Figure 16:
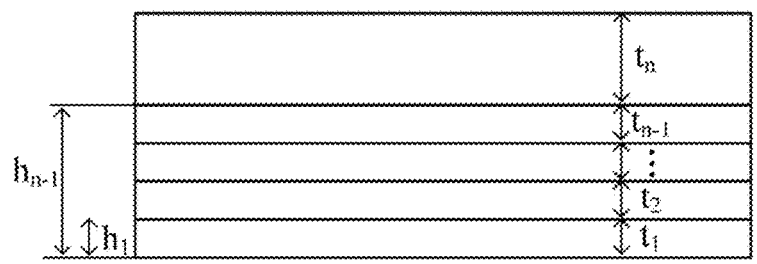
FIG. 16 is a schematic view of stacking of film layers of a touch display panel.

Exemplarily, FIG. 16 is a schematic view of stacking of film layers of a touch display panel. It is understood that if a position of the touch wires and a position of the signal wires in the array layer are changed in a stacking material or a stacking film thickness, then positions of neutral surfaces in different areas are changed, stresses of film layers where the wires are located are changed, the film thickness may be adjusted according to formula (1), multi-neutral-surface design of the bending area is achieved, and the bending performance is ensured. In specific implementation, a simulation software may be used for designing each film layer.

Figure 19:
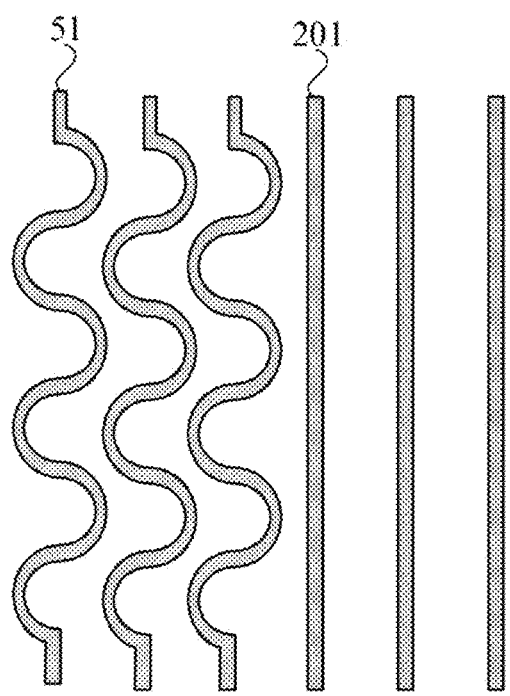
FIG. 19 is a schematic top view of wire layout in a bending area provided in an embodiment of the present disclosure.

In other embodiments, if a width, a thickness, a spacing and other parameters of the touch wires and those of the signal wires in the bending area are different, a shape of the wires may be adjusted to balance the stress of the bending area. Optionally, the non-display area includes the bending area, and the bending area is located in the first area; a thickness of the touch wire located on the bottom surface of the first area is different from a thickness of the signal wire extending to the non-display area, and at least one of the touch wire or the signal wire extends along a curve in the bending area. FIG. 19 is a schematic top view of wires in a bending area provided in an embodiment of the present disclosure, exemplarily, in order to balance a stress when the bending area is bent, the touch wires 51 are disposed to be in a curved shape, and the signal wires 201 are disposed to be in a straight line shape. In other embodiments, the touch wires may be disposed to be in the straight line shape, the signal wires may be disposed to be in the curved shape; or both the touch wires and the signal wires may be disposed to be curved, but have different degrees of curvature. The bending stress in different areas is balanced by means of designing at least one of the touch wires or the signal wires to extend along curves, adjusting the stacking of the film layers and the like, so that the reliability of the bending area is improved.

Figure 17:
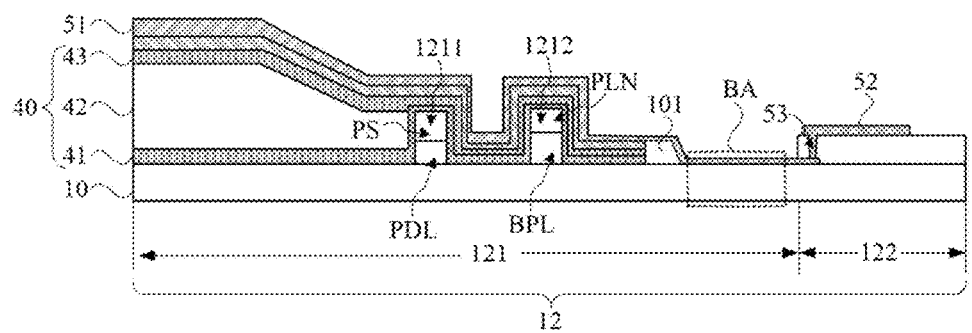
FIG. 17 is still another schematic cross-sectional view taken along a section line BB' of FIG. 4.

In the touch display panel provided in the embodiments of the present disclosure, a wire switching design of the touch wires is cancelled in the bending area, so that in some embodiments, a problem that the electrostatic is easily accumulated when the touch wires are relatively long may exist, and in order to discharge the electrostatic, a wire switching hole may be provided at a side of the bending area away from the display area for the wire switching design. Exemplarily, FIG. 17 is still another schematic cross-sectional view taken along a section line BB' of FIG. 4. Referring to FIG. 17, optionally, the second area 122 includes multiple first wires 52 in one-to-one correspondence with the touch wires 51, and each of the first wires 52 is electrically connected to a respective one of the touch wires 51 through a via hole 53 located in the second area 122. The inorganic encapsulation layer does not affect the via hole 53 since the via hole 53 is relatively far from the boundary of the CVD.

Optionally, the touch display panel provided in the embodiment further includes an array layer, and the array layer is located between the substrate and the light-emitting components; the array layer includes multiple signal wires, and the first wires are located on a same layer as part of the signal wires. In specific implementation, the first wires and part of the signal wires (such as a scanning signal line or a data signal line, and may be selected according to actual conditions in specific implementation) may be located on a same layer and formed simultaneously by using a same process, so that the manufacturing difficulty of the touch display panel is reduced.

Figure 18:
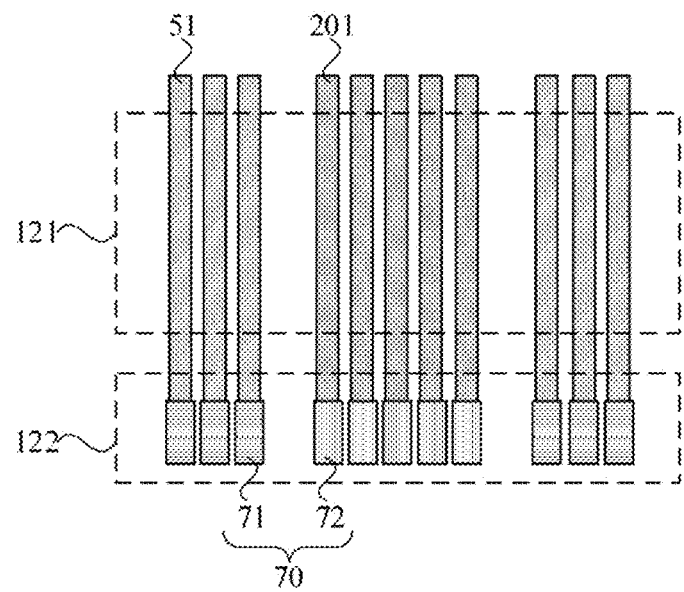
FIG. 18 is a schematic perspective view of a non-display area of a touch display panel provided in an embodiment of the present disclosure.

FIG. 18 is a schematic perspective view of a non-display area of a touch display panel provided in an embodiment of the present disclosure. Referring to FIG. 18, optionally, the second area 122 includes multiple signal terminals 70, and the multiple signal terminals 70 include first signal terminals 71 and second signal terminals 72. The first signal terminals 71 are connected to the touch wires 51, and the second signal terminals 72 are connected to the signal wires 201.

The first signal terminals 71 may be connected to a touch driver chip, the second signal terminals 72 may be connected to a display driver chip, and in other embodiments, the first signal terminals 71 and the second signal terminals 72 may be connected to a touch and display driver integration (TDDI) chip to simplify the structure of the panel. It is understood that the signal wires 201 shown in FIG. 18 being located in a middle area and the touch wires 51 being located at two lateral areas are merely schematic and are not limiting of the embodiments of the present disclosure.

Figure 20:
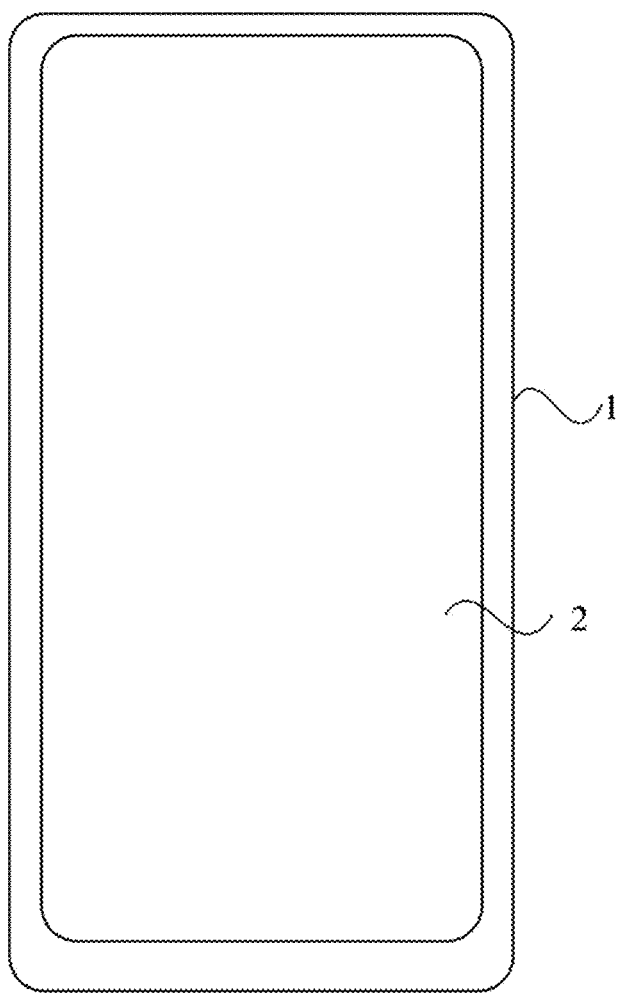
FIG. 20 is a schematic structural view of a touch display device provided in an embodiment of the present disclosure.

FIG. 20 is a schematic structural view of a touch display device provided in an embodiment of the present disclosure. Referring to FIG. 20, the touch display device 1 includes any touch display panel 2 provided in the embodiments of the present disclosure. The touch display device 1 may specifically be a mobile phone, a computer, an intelligent wearable equipment and the like.

It should be noted that the above are merely preferred embodiments of the present disclosure and the technical principles applied herein. It should be understood by those skilled in the art that the present disclosure is not limited to the particular embodiments described herein. For those skilled in the art, various apparent modifications, adaptations, combinations and substitutions may be made without departing from the scope of the present disclosure. Therefore, although the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A touch display panel, comprising:
   a substrate, which comprises a display area and a non-display area;
   a light-emitting component, which is located within the display area;
   an encapsulation layer, which covers the light-emitting component and at least part of the non-display area;
   a touch layer, which is located at a side of the encapsulation layer away from the light-emitting component, the touch layer comprising a plurality of touch electrodes; and
   a plurality of touch wires, wherein the plurality of touch wires are directly electrically connected to the plurality of touch electrodes, and the plurality of touch wires extend to the non-display area;
   wherein the non-display area comprises a first area and a second area, at least part of film layers within the first area are formed with at least one of a through hole or a groove, the plurality of touch wires extend along a surface of the first area and extend into the second area, and the second area is located at a side of the first area away from the display area;
   wherein the non-display area comprises a first organic layer covering the touch wires in the first area; the first organic layer further comprises a plurality of first grooves which are located on a side of the first organic layer away from the touch wires; and
   wherein
   a first film layer within the first area is formed with the through hole, a second film layer within the first area is formed with the groove, and the plurality of touch wires extend along a first side wall of the through hole, a first side wall of the groove, a bottom surface of the groove, a second side wall of the groove, and a second side wall of the through hole, and extend into the second area.

2. The touch display panel according to claim 1, wherein the non-display area comprises a bending area located within the first area.

3. The touch display panel according to claim 1, further comprising an array layer located between the substrate and the light-emitting component; and wherein the array layer comprises a plurality of signal wires, and at least part of the plurality of signal wires extend to the non-display area.

4. The touch display panel according to claim 3, wherein the plurality of touch wires extend on side walls and a bottom surface of the first area, and the touch wires located on the bottom surface of the first area are located on a same layer as the at least part of the plurality of signal wires extending to the non-display area.

5. The touch display panel according to claim 4, wherein the plurality of touch wires and the plurality of signal wires are made of a same material.

6. The touch display panel according to claim 3; wherein the plurality of touch wires extend on side walls and a bottom surface of the first area; the touch wires located on the bottom surface of the first area are located on a different film layer from the at least part of the plurality of signal wires extending to the non-display area.

7. The touch display panel according to claim 6, wherein the plurality of touch wires and the plurality of signal wires are made of a same material.

8. The touch display panel according to claim 6, wherein the non-display area comprises a bending area located within the first area;

and a neutral surface of the bending area is designed according to following formula:

$$\gamma = \frac{\sum_{k=1}^{n} E_k(h_k^2 - h_{k-1}^2)}{2\sum_{k=1}^{n} E_k t_k};$$

where n represents a quantity of laminated film layers, n is an integer larger than or equal to 2, $E_k$ represents an elastic modulus of a $k_{th}$ film layer, $t_k$ represents a thickness of the $k_{th}$ film layer, and $h_k$ represents a thickness from a $1_{st}$ film layer to the $k_{th}$ film layer, $\gamma$ is a position of the neutral surface of the bending area.

9. The touch display panel according to claim 4, wherein the non-display area comprises a bending area located within the first area; and
wherein a thickness of the touch wires located on the bottom surface of the first area is different from a thickness of the at least part of the plurality of signal wires extending to the non-display area, and at least one of the touch wires or the signal wires extends along curves in the bending area.

10. The touch display panel according to claim 1, wherein the second area comprises a plurality of first wires in one-to-one correspondence with the plurality of touch wires, and each of the plurality of first wires is electrically connected to a respective one of the plurality of touch wires through a via hole located in the second area.

11. The touch display panel according to claim 10, further comprising an array layer located between the substrate and the light-emitting component; and
wherein the array layer comprises a plurality of signal wires, and the plurality of first wires are located on a same layer as part of the plurality of signal wires.

12. The touch display panel according to claim 3, wherein the second area comprises a plurality of signal terminals, the plurality of signal terminals comprising first signal terminals and second signal terminals; and
wherein the first signal terminals are connected to the plurality of touch wires, and the second signal terminals are connected to the plurality of signal wires.

13. The touch display panel according to claim 6, wherein the non-display area comprises a bending area located within the first area; and
wherein a thickness of the touch wires located on the bottom surface of the first area is different from a thickness of the at least part of the plurality of signal wires extending to the non-display area, and at least one of the touch wires or the signal wires extends along curves in the bending area.

14. A touch display device, comprising a touch display panel, wherein the touch display panel comprises:
a substrate, which comprises a display area and a non-display area;
a light-emitting component, which is located within the display area;
an encapsulation layer, which covers the light-emitting component and at least part of the non-display area;
a touch layer, which is located at a side of the encapsulation layer away from the light-emitting component, the touch layer comprising a plurality of touch electrodes; and
a plurality of touch wires, wherein the plurality of touch wires are directly electrically connected to the plurality of touch electrodes, and the plurality of touch wires extend to the non-display area;
wherein the non-display area comprises a first area and a second area, at least part of film layers within the first area are formed with at least one of a through hole or a groove, the plurality of touch wires extend along a surface of the first area and extend into the second area, and the second area is located at a side of the first area away from the display area;
wherein the non-display area comprises a first organic layer covering the touch wires in the first area; the first organic layer further comprises a plurality of first grooves which are located on a side of the first organic layer away from the touch wires; and
wherein
a first film layer within the first area is formed with the through hole, a second film layer within the first area is formed with the groove, and the plurality of touch wires extend along a first side wall of the through hole, a first side wall of the groove, a bottom surface of the groove, a second side wall of the groove, and a second side wall of the through hole, and extend into the second area.

15. The touch display device according to claim 14, wherein the non-display area comprises a bending area located within the first area.

16. The touch display device according to claim 14, wherein the second area comprises a plurality of first wires in one-to-one correspondence with the plurality of touch wires, and each of the plurality of first wires is electrically connected to a respective one of the plurality of touch wires through a via hole located in the second area.

17. The touch display panel according to claim 1, wherein the first area is provided with a first retaining wall and a second retaining wall, the first retaining wall is used for defining a boundary of an organic encapsulation layer in the encapsulation layer, the organic encapsulation layer comprises a first inorganic encapsulation layer and a second inorganic encapsulation layer, and the first inorganic encapsulation layer and the second inorganic encapsulation layer extend to the second retaining wall.

\* \* \* \* \*